(12) United States Patent
Park et al.

(10) Patent No.: US 7,362,167 B2
(45) Date of Patent: Apr. 22, 2008

(54) VOLTAGE GENERATOR

(75) Inventors: Kee-Teok Park, Kyoungki-do (KR);
Ji-Eun Jang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/526,815

(22) Filed: Sep. 26, 2006

(65) Prior Publication Data

US 2007/0070722 A1   Mar. 29, 2007

(30) Foreign Application Priority Data

Sep. 29, 2005 (KR) ............... 10-2005-0091569
Mar. 31, 2006 (KR) ............... 10-2006-0029654

(51) Int. Cl.
*G05F 1/10* (2006.01)

(52) U.S. Cl. ................ 327/543; 365/189.09

(58) Field of Classification Search ............... None
See application file for complete search history.

(56) References Cited

U.S. PATENT DOCUMENTS 6,265,858 B1   7/2001   Park 6,721,211 B2 *  4/2004  Lee et al. ............ 365/189.09
7,053,677 B2 *  5/2006  Yu et al. ................. 327/108
2004/0251957 A1 * 12/2004  Do ........................... 327/541

FOREIGN PATENT DOCUMENTS

| JP | 9-106676 A | 4/1997 |
|----|-----------|--------|
| KR | 1996-0030231 | 8/1996 |
| KR | 2002-0017393 | 3/2002 |

* cited by examiner

*Primary Examiner*—Cassandra Cox
(74) *Attorney, Agent, or Firm*—McDermott Will & Emery LLP

(57) ABSTRACT

A voltage generator reduces a stand by current in a stand by or a self-refresh mode and shortens a response time in an active mode by selectively driving a control transistor of a final driver. A core voltage control unit provides a power voltage. Pull-up and pull-down driving signals are generated based on the power voltage. An output driver generates an internal voltage according to the pull-up and pull-down driving signals. An active control unit controls drivability of the core voltage control unit in response to bank active signals.

36 Claims, 4 Drawing Sheets

VOLTAGE GENERATOR

FIELD OF THE INVENTION

The present invention relates to a semiconductor memory device; and, more particularly, to a bit-line precharge voltage (VBLP) or a cell plate voltage (VCP) generator reducing a stand-by current in a stand-by mode or a self-refresh mode and shortening a response time in an active mode by selectively driving a control transistor of a output driver.

DESCRIPTION OF RELATED ARTS

A semiconductor memory device often has a low-grade drivability according to varied conditions under a fabrication process. If drivability for an internal voltage is decreased, a level of the internal voltage can fluctuate and, thereby, the unstable internal voltage can cause malfunction of the semiconductor memory device. Because higher integration of the semiconductor memory device increases alternations or limitations on the fabrication process, a level of a core voltage (VCORE) can be decreased and drivability for the VBLP and the VCP in the semiconductor memory device lessens.

FIG. 1 is a schematic circuit diagram of a conventional VBLP generator.

The conventional voltage generator includes a core voltage control unit 10 and an output driver 20. The core voltage control unit 10 includes a core voltage generator 11, a bias voltage generator 12, a gate voltage generator 13, and pull-up and pull-down voltage drivers 14 and 15.

The core voltage generator 11 induces a half core voltage used as a reference for generating the VBLP and the VCP. The core voltage generator 11 is provided with PMOS transistors P1 and P2 and resistors R1 and R2 connected in series between the VCORE and a ground voltage (VSS), generating a reference voltage VREF by embodying a voltage divider having self bias diode resistors and line resistors. When a power voltage is supplied from an external device, the reference voltage VREF is generated by the voltage divider described in FIG. 1. Otherwise, if the power voltage is supplied internally, the reference voltage VREF can be generated by a reference voltage generator included in another device.

The bias voltage generator 12 generates bias voltages PBIAS and NBIAS based on the reference voltage VREF. The bias voltage generator 12 includes PMOS transistors P3 to P5 and NMOS transistors N1 to N5. The third PMOS transistor P3 and the first and the third NMOS transistors N1 and N3, connected in series between the VCORE and the VSS, provide a predetermined current flow to a terminal supplied with the VSS. A gate of the third PMOS transistor P3 receives the reference voltage VREF, and a gate and a drain of each of the first and the third NMOS transistors N1 and N3 are coupled The fourth PMOS transistor P4 and the second and the fourth NMOS transistors N2 and N4, connected in series between the VCORE and the VSS, form a current mirror for providing a predetermined current from a terminal supplied with the VCORE. A gate and a drain of the fourth PMOS transistor P4 are coupled together. Gates of the first and the second NMOS transistors N1 and N2, and gates of the third and the fourth NMOS transistors N3 and N4 are coupled respectively. Accordingly, the current through the first and the third NMOS transistors N1 and N3 is same as the current through the second and the fourth NMOS transistors N2 and N4.

The fifth PMOS transistor P5 connected between the VCORE and a seventh NMOS transistor N7 forms a current mirror with the fourth PMOS transistor P4, wherein gates of the fourth and the fifth PMOS transistors P4 and P5 are coupled. A gate of the fifth NMOS transistor N5, connected between the VSS and a seventh PMOS transistor P7, is supplied with the bias voltage NBIAS.

The gate voltage generator 13 has a current mirror structure provided with NMOS transistors N7 and N8, wherein a gate voltage NGATE is produced, and PMOS transistors P7 and P8, wherein a gate voltage PGATE is produced. The gate voltage generator 13 generates the gate voltages NGATE and PGATE. The gate voltage NGATE is higher than the reference voltage VREF by a threshold voltage of the seventh NMOS transistor N7. The gate voltage PGATE is lower than the reference voltage VREF by a threshold voltage of the seventh PMOS transistor P7.

The pull-up voltage driver 14 includes a sixth PMOS transistor P6. A gate of the sixth PMOS transistor P6, connected between the VCORE and the eighth NMOS transistor N8, receives the bias voltage PBIAS.

The pull-down voltage driver 15 includes a sixth NMOS transistor N6. A gate of the sixth NMOS transistor N6, connected between the VSS and the eighth PMOS transistor P8, receives the bias voltage NBIAS.

The output driver 20 further includes a ninth PMOS transistor P9 and a ninth NMOS transistor N9. The ninth PMOS transistor P9 and the ninth NMOS transistor N9, whose gates respectively receive pull-up and pull-down driving signals PDRV and NDRV, and drains coupled with each other to output the VBLP, are connected in series between the VCORE and the VSS.

The operation process of the conventional voltage generator is described below.

The PMOS transistor P6 is always turned on and serves as a resistor and thereby maintains a constant current. The eighth NMOS transistor N8 functions as a source follower operating fast according to the level of the VBLP.

If the VBLP is decreases, the gate voltage NGATE of the eighth NMOS transistor N8 is higher than a source voltage of the eighth NMOS transistor N8. Accordingly, the current flows fast through the eighth NMOS transistor N8, and a level of the pull-up driving signal PDRV decreases. Thus, the ninth PMOS transistor P9 is turned on and increases the level of the VBLP.

The sixth NMOS transistor N6 is always turned on and serves as a resistor and thereby maintains a constant current. The eighth PMOS transistor P8 functions as a source follower operating fast according to the level of the VBLP.

If the VBLP is increases, the gate voltage PGATE of the eighth PMOS transistor P8 is lower than a source voltage of the eighth PMOS transistor P8. Accordingly, the current flows fast through the eighth PMOS transistor P8, and a level of the pull-down driving signal NDRV increases. Thus, the ninth NMOS transistor N9 is turned on and decreases the level of the VBLP.

In the conventional voltage generator, the output driver 20 is provided with the ninth PMOS transistor P9 and the ninth NMOS transistor N9 having a slim low threshold voltage in order to prevent decrease or drop of drivability when an internal power voltage has a low level. While the operation is improved in active and read/write modes, a large amount of off leakage currents flow in a precharge mode.

When the threshold voltage of the ninth PMOS transistor P9 or the ninth NMOS transistor N9 is less than the standard, a precharge, i.e., stand-by, current is generated by a large amount of off leakage currents. Particularly, in low-power and mobile products wherein existence of the stand-by current is critical, a serious malfunction or ineffective performance may result.

When drivability of the sixth PMOS transistor P6 and the sixth NMOS transistor N6 is increased to reduce the leakage current of the output driver, i.e., the ninth PMOS transistor P9 or the ninth NMOS transistor N9, drivability of the ninth PMON transistor P9 and the ninth NMOS transistor N9 is decreased respectively in the active mode.

When the VBLP is unstable in the stand-by mode, the output driver 20 turns on fast, because the eighth PMOS transistor P8 operates as the source follower. However, the output driver 20 turns off late, because a minimum current is supplied for reducing the stand-by current.

Accordingly, the on and off timings of the output driver are mismatched. When the ninth PMOS transistor P9 and the ninth NMOS transistor N9 turn on at the same time, current flows directly.

The direct current in operation mode as well as the stand-by current generates a ringing current in stand-by or operation mode and makes the drivability of the chip poor.

SUMMARY OF THE INVENTION

It is, therefore, an object of the present invention to provide a method for reducing a stand-by current and shortening a response time in a semiconductor memory device by controlling transistors included in an output driver in a stand-by or a self refresh mode and an active mode.

In accordance with an aspect of the present invention, there is provided a voltage generator, including a core voltage control unit for generating pull-up and pull-down driving signals based on a power voltage, a output driver for generating an internal voltage according to the pull-up and pull-down driving signals, and an active control unit for controlling a drivability of the core voltage control unit in response to bank active signals

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 2:
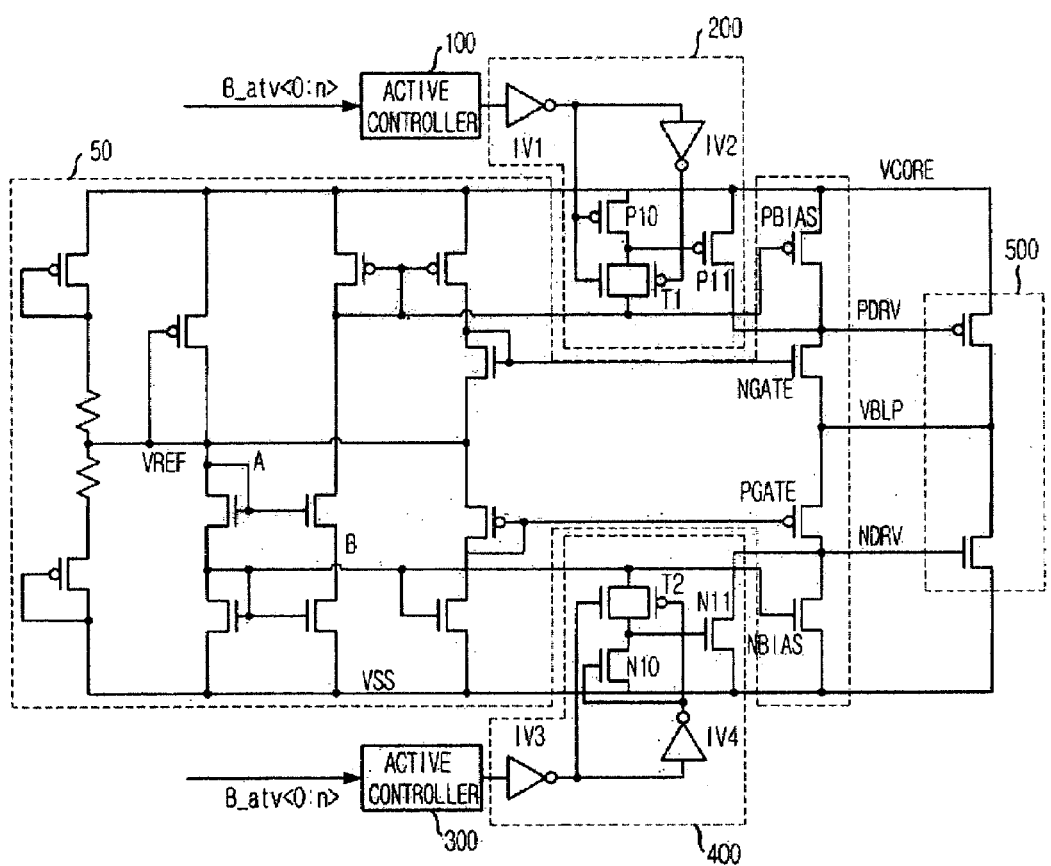
FIG. 2 is a schematic circuit diagram of a voltage generator in accordance with the present invention.

FIG. 2 is a schematic circuit diagram of a voltage generator in accordance with the present invention.

The voltage generator includes a core voltage control unit 50, an output driver 500 and active control units 100 to 400.

The core voltage control unit 50 includes a core voltage generator, a bias voltage generator, a gate voltage generator, and pull-up and pull-down voltage drivers.

Figure 1:
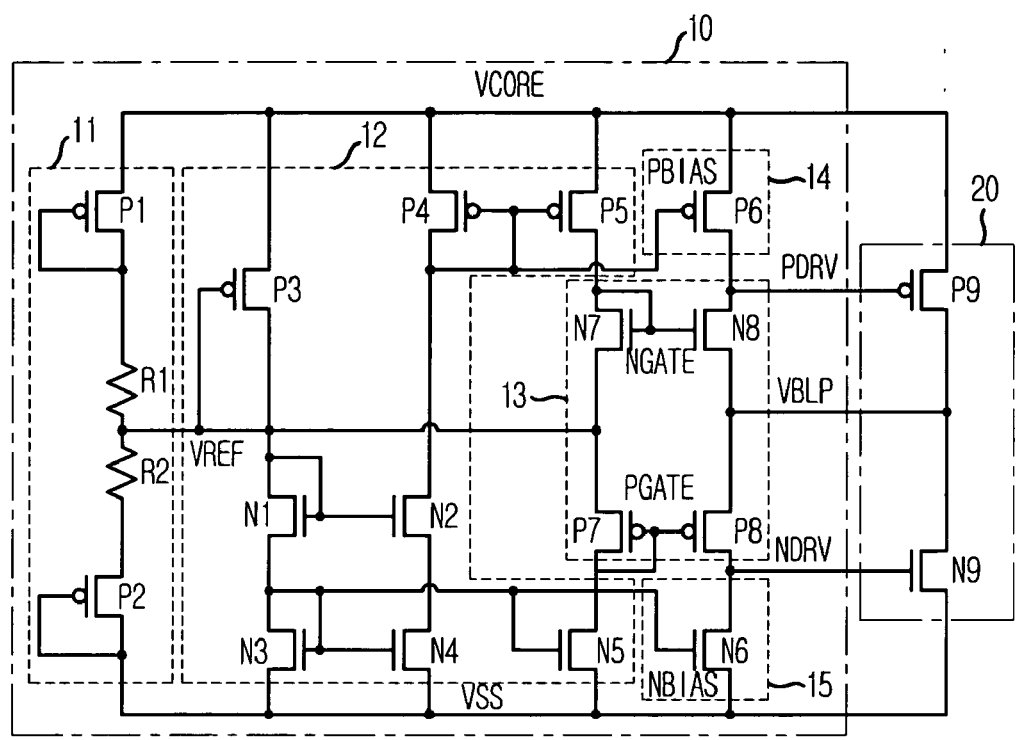
FIG. 1 is a schematic circuit diagram of a conventional voltage generator.

The core voltage control unit 50 and the output driver 500 have the same composition as the conventional embodiment of FIG. 1. Further detailed explanation of the composition and operation thereof, therefore, is omitted.

The present invention additionally includes active control units provided with first and second active controllers 100 and 300 and first and second selecting drivers 200 and 400.

The first active controller 100 activates each bank in response to bank active signals B_atv<0:n> by a driving control signal.

The first selecting driver 200 includes tenth and eleventh PMOS transistors P10 and P11, first and second inverters IV1 and IV2 and a first transmission gate T1. The first inverter IV1 inverts an output of the first active controller 100. The tenth PMOS transistor P10, connected between a VCORE and the first transmission gate T1, receives an output of the first inverter IV1 through a gate. A gate of the eleventh PMOS transistor P11, connected between the VCORE and the pull-up driving signal PDRV, is coupled with a drain of the tenth PMOS transistor P10.

The second inverter IV2 inverts an output of the first inverter IV1. The first transmission gate T1 selectively connects the drain of the tenth PMOS transistor P10 with the bias voltage PBIAS in response to outputs of the first and the second inverters IV1 and IV2.

Similarly, the active controller 300 activates each bank in response to the bank active signals B_atv<0:n> by a driving control signal.

The second selecting driver 400 includes tenth and eleventh NMOS transistors N10 and N11, third and fourth inverters IV3 and IV4 and a second transmission gate T2. The third inverter IV3 inverts an output of the active controller 300. The tenth NMOS transistor N10, connected between a VSS and the second transmission gate T2, receives an output of the fourth inverter IV4 through a gate. A gate of the eleventh NMOS transistor N11, connected between the VSS and the pull-down driving signal NDRV, is coupled with a drain of the tenth NMOS transistor N10.

The fourth inverter IV4 inverts an output of the third inverter IV3. The second transmission gate T2 selectively connects the drain of the tenth NMOS transistor N10 with the bias voltage NBIAS in response to outputs of the third and the fourth inverters IV3 and IV4.

Figure 3:
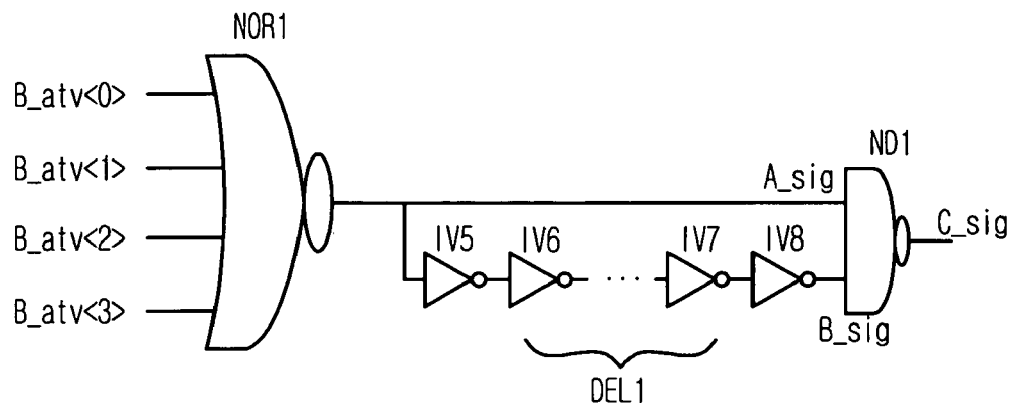
FIG. 3 is a schematic circuit diagram of an active controller shown in FIG. 2.

FIG. 3 is a schematic circuit diagram of the first active controllers 100 shown in FIG. 2.

The first and second active controllers 100 and 300 have the same elements. The detailed composition of the active controller 100 is explained as embodiment of the present invention. As a modification, only one of the first and the second active controllers can generate control signals to both the first and the second selecting drivers 200 and 400.

The active controller 100 includes a first NOR gate NOR1, inverters IN5 to IV8 and a first NAND gate ND1. The first NOR gate NOR1 outputs a signal A_sig after performing a logic NOR operation to bank active signals B_atv<0> to B_atv<3>. Delaying an output of the first NOR gate NOR1 in a delay time DEL1, the fifth to the eighth inverters IN5 to IN8 output a signal B_sig. The first NAND gate ND1 performs a logic NAND operation to the signal A_sig and the signal B_sig to thereby output a signal C_sig.

Figure 4:
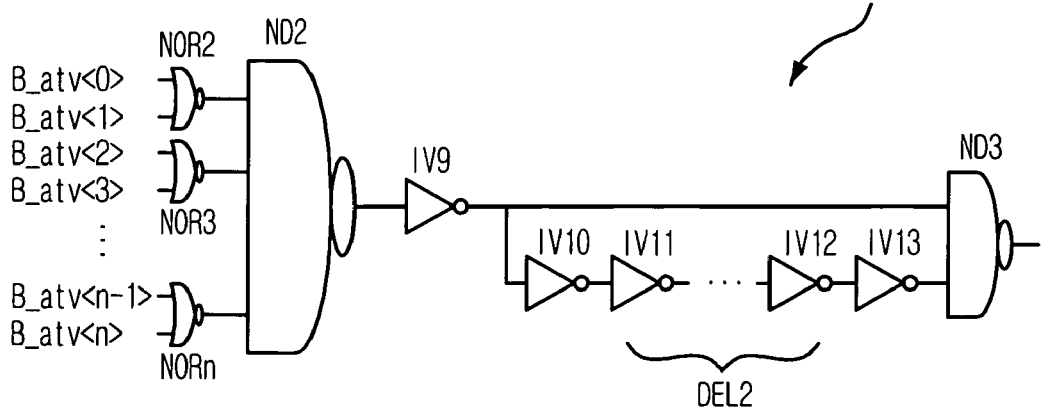
FIG. 4 is a schematic circuit diagram of the active controller shown in FIG. 2 in accordance with another embodiment.

FIG. 4 is a schematic circuit diagram of the active controller shown in FIG. 2 in accordance with another embodiment.

The active controller 100A includes a plurality of NOR gates NOR2 to NORn (n is a positive integer), first and second NAND gates ND2 and ND3 and a plurality of inverters IN9 to IV13.

The NOR gate NOR2 performs a logic NOR operation to the first and second bank active signals B_atv<0> and B_atv<1>. The NOR gate NOR3 performs a logic NOR operation to the third and fourth bank active signals B_atv<2> and B_atv<3>. The NOR gate NORn performs a logic NOR operation to bank active signals B_atv<n-1> and B_atv<n>

The first NAND gate ND2 performs a logic NAND operation to outputs of the NOR gates NOR2 to NORn. The fifth inverter IN9 inverts an output of the first NAND gate ND2. The inverters V10 to IV13 delay an output of the fifth inverter IV9. The second NAND gate ND3 performs a logic NAND operation to the output of the fifth inverter IV9 and an output of the inverter IV13.

Figure 5:
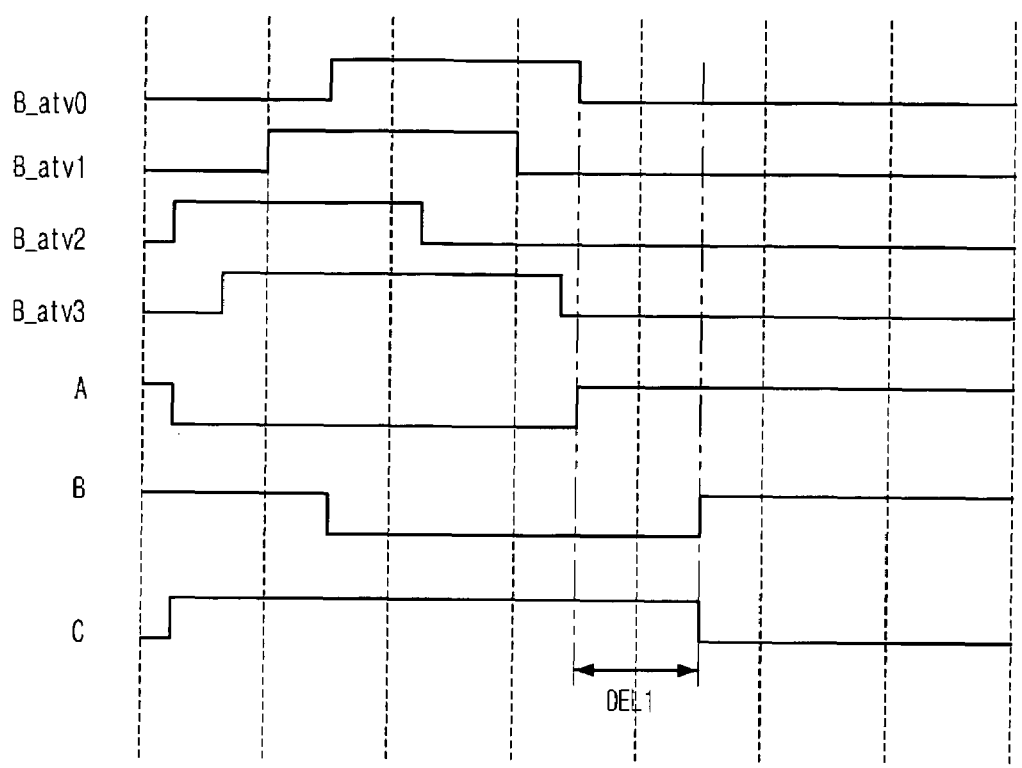
FIG. 5 is a waveform explaining an operation of the voltage generator in accordance with the present invention.

Referring to FIG. 5, the operation process of the present invention is described below.

The bias voltage PBIAS is lower than the VCORE by a threshold voltage VT of the sixth PMOS transistor P6. The bias voltage PBIAS is supplied to the sixth PMOS transistor P6 in order to generate a predetermined current flowing through the sixth PMOS transistor P6. The bias voltage NBIAS is higher than the VSS by the threshold voltage VT of the sixth NMOS transistor N6. The bias voltage NBIAS is supplied to the sixth NMOS transistor N6 to generate a predetermined current flowing through the sixth NMOS transistor N6.

The eighth NMOS transistor N8 and the eighth PMOS transistor P8 having sources connected to the VBLP operate fast according to the level of the VBLP. Each of the eighth NMOS transistor N8 and the eighth PMOS transistor P8 served as a source follower turns on/off each of the ninth PMOS transistor P9 and the ninth NMOS transistor N9 respectively, according to the level of the VBLP.

In order to improve drivability of an output terminal in an active mode and reduce a leakage current in a stand-by mode, the present invention changes the number of the conventional transistors controlling the output driver 500 according to stand-by and active modes.

In the stand-by mode, by operating the sixth and the eleventh PMOS transistors P6 and P11 and the sixth and the eleventh NMOS transistors N6 and N11, the drivability of the output terminal decreases. Accordingly, the consumption of the stand-by current is reduced.

The bank active signals B_atv<0:n> have a logic low level in the stand-by mode. The driving control signal output by the active controller 100 has a logic low level.

Accordingly, the first transmission gate T1 turns on, and gates of the sixth and eleventh PMOS transistors P6 and P11 are coupled. The tenth PMOS transistor P10 receiving a logic high level signal through a gate persists to turn off. The sixth and eleventh PMOS transistors P6 and P11 turn on by the bias voltage PBIAS.

Similarly, the driving control signal output by the active controller 300 has a logic low level by all the bank active signals B_atv<0:n> having a logic low level.

Accordingly, the transmission gate T2 turns on, and gates of the sixth and eleventh NMOS transistor N6 and N11 are coupled. The tenth NMOS transistor N10 receiving a logic low level signal through a gate persists to turn off. The sixth and eleventh PMOS transistor N6 and N11 turn on by the bias voltage NBIAS.

In active mode, the eleventh PMOS transistor P11 and the eleventh NMOS transistor N11 turn off, and the sixth PMOS transistor P6 and sixth NMOS transistor N6 turn on according to the outputs of the active controllers 100 and 300. A current output to the output driver 500 increases, which continues on for a longer period than an active mode period in the other devices. Increasing drivability of the output driver 500, the operation process improves in the active mode consequently.

The active controllers 100 and 300 receive and perform a logic NOR operation to the bank active signals B_atv<0:n> representing an active period of each bank. Referring to FIG. 5, in the event that at least one of the bank active signals B_atv<0:n> is activated, the output signal A_sig of the first NOR gate NOR1 has a logic low level. The signal A_sig has a logic low level in the whole active period of the banks, and the signal B_sig delayed by the delay time DEL1 of the sixth and seventh inverters IV6 and IV7 has a logic low level.

Consequently, the output signal C_sig of the active controllers 100 and 300 is activated in synchronization with inactivation of the signal A_sig, and is inactivated in synchronization with activation of the signal B_sig. The signal C_sig is activated during the inactivation period of the signal A_sig and the delay time DEL1. During the activation period of the signal C_sig in the active mode, the drivability of the transistors in the pull-up and the pull-down voltage drivers decease.

The delay time DEL1 is pre-determined time by the sixth and seventh inverters IV6 and IV7.

When at least one of the bank active signals B_atv<0:n> is activated, the driving control signal output from the active controller 100 is activated.

The first transmission gate T1 turns off and the tenth PMOS transistor P10 turns on. The eleventh PMOS transistor P11 receiving the VCORE through the gate keeps a turn-off state.

Similarly, When at least one of the bank active signals B_atv<0:n> is activated, the driving control signal output from the active controller 300 is activated.

The second transmission gate T2 turns off and the tenth NMOS transistor N10 turns on. The eleventh PMOS transistor N11 receiving the VSS through the gate persists to turn off.

The active controller 100 for pull-up driving and the active controller 300 for pull-down driving having the same delay time are described above. However, the delay times of the active controllers 100 and 300 could be set up differently in the present invention.

Described above, the present invention has an effect on reducing the leakage current for guaranteeing an output margin in the stand-by mode and improving drivability of the output terminal to stabilize a DRAM operation in active mode by selectively driving a transistor controlling the output driver in both the stand by or the self refresh mode and the active mode.

The present application contains subject matter related to Korean patent applications Nos. 10-2005-0091569 and 10-2006-0029654, filed in the Korean Patent Office on Sep. 29, 2005 and Mar. 31, 2006, respectively, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A voltage generator, comprising:
   a core voltage control unit for generating pull-up and pull-down driving signals base on a power voltage;

a output driver for generating an internal voltage according to the pull-up and pull-down driving signals; and
an active control unit for controlling a drivability of the core voltage control unit in response to bank active signals.

2. The voltage generator as recited in claim 1, wherein the core voltage control unit generates a reference voltage having a half level of the power voltage.

3. The voltage generator as recited in claim 1, wherein the pull-up driving signal has a higher threshold voltage level than the reference voltage and the pull-down driving signal has a lower threshold voltage level than the reference voltage.

4. The voltage generator as recited in claim 1, wherein the internal voltage is used for precharging bit lines and supplying a cell plate.

5. The voltage generator as recited in claim 1, wherein the active control unit includes:
  means for increasing a number of control transistors of the pull-up/down voltage drivers in response to inactivation of the bank active signals in a stand-by mode; and
  means for decreasing the number of control transistors of the pull-up/down voltage drivers in response to activation of the bank active signals in an active mode.

6. The voltage generator as recited in claim 5, wherein the active control unit includes:
  a first active control unit for changing the number of the transistors in the pull-up voltage driver according to the bank active signals; and
  a second active control unit for changing the number of the transistor in the pull-down voltage driver according to the bank active signals.

7. The voltage generator as recited in claim 6, wherein the first active control unit includes:
  a pull-up active controller for outputting a first driving control signal in response to a result of comparing the plurality of bank active signals; and
  a first selecting driver for selectively controlling the number of the transistors in the pull-up voltage driver according to the first driving control signal.

8. The voltage generator as recited in claim 7, wherein the pull-up active controller activates and outputs the first driving control signal in the event that at least one of the plurality of bank active signals is activated.

9. The voltage generator as recited in claim 8, wherein the pull-up active controller includes:
  a first logic operator for performing a logic operation to the plurality of bank active signals;
  a first delay unit for delaying an output of the first logic operator; and
  a second logic operator for performing a logic operation to the output of the first logic operator and an output of the first delay unit.

10. The voltage generator as recited in claim 9, wherein the first logic operator activates an output in the event that at least one of the plurality of bank active signals is activated.

11. The voltage generator as recited in claim 9, wherein the first logic operator includes a first NOR gate.

12. The voltage generator as recited in claim 11, wherein the first delay unit includes a first inverter chain including a plurality of inverters connected in series.

13. The voltage generator as recited in claim 12, wherein the second logic operator includes a first NAND gate.

14. The voltage generator as recited in claim 9, wherein the first logic operator includes:

a plurality of NOR gates for performing a logic NOR operation to the plurality of bank active signals in each pairs; and
a first NAND gate for performing a logic NAND operation to outputs of the plurality of NOR gates.

15. The voltage generator as recited in claim 14, wherein the first delay unit includes:
  a first inverter for inverting an output of the first logic operator; and
  a first inverter chain for including a plurality of inverters connected in series and inverting an output of the first inverter.

16. The voltage generator as recited in claim 9, wherein the first driving control signal is activated during the activation period of the plurality of bank active signals and delay time of the first delay unit.

17. The voltage generator as recited in claim 9, wherein the first driving control signal is activated in synchronization with inactivation of a signal output by the first logic operator and inactivated in synchronization with activation of a signal output by the first delay unit.

18. The voltage generator as recited in claim 7, wherein the first selecting driver includes:
  a pull-up driver connected between the VCORE and an output stage of the pull-up driving signal for receiving the bias voltage through the gate; and
  a first selecting unit for selectively operating the pull-up driver according to the first driving control signal.

19. The voltage generator as recited in claim 18, wherein the pull-up driver includes a first PMOS transistor.

20. The voltage generator as recited in claim 18, wherein the first selecting unit includes:
  a first inverter for inverting the first driving control signal;
  a second inverter for inverting an output of the first inverter;
  a second PMOS transistor connected between the VCORE and a gate of the pull-up driver for receiving an output of the first inverter through a gate; and
  a first transmission gate for selectively connecting the gate of the pull-up driver with the bias voltage according to outputs of the first and the second inverters.

21. The voltage generator as recited in claim 6, wherein the second active control unit includes:
  a pull-down active controller for outputting a second driving control signal in response to a result of comparing the plurality of bank active signals; and
  a second selecting driver for selectively controlling the number of the transistors in the pull-down voltage driver according to the second driving control signal.

22. The voltage generator as recited in claim 21, wherein the pull-down active controller activates and outputs the second driving control signal in the event that at least one of the plurality of bank active signals is activated.

23. The voltage generator as recited in claim 21, wherein the pull-down active controller includes:
  a third logic operator for performing a logic operation to the plurality of bank active signals;
  a second delay unit for delaying an output of the third logic operator; and
  a fourth logic operator for performing a logic operation to the output of the third logic operator and an output of the second delay unit.

24. The voltage generator as recited in claim 23, wherein the third logic operator activates an output in the event that at least one of the plurality of bank active signals is activated.

25. The voltage generator as recited in claim 23, wherein the third logic operator includes a second NOR gate.

26. The voltage generator as recited in claim 25, wherein the second delay unit includes a second inverter chain including a plurality of inverters connected in series.

27. The voltage generator as recited in claim 26, wherein the fourth logic operator includes a second NAND gate.

28. The voltage generator as recited in claim 23, wherein the third logic operator includes:
- a plurality of NOR gates for performing a logic NOR-operation to the plurality of bank active signals in each pairs; and
- a third NAND gate for performing a logic NAND operation to outputs of the plurality of NOR gates.

29. The voltage generator as recited in claim 28, wherein the second delay unit includes:
- a fourth inverter for inverting an output of the third logic operator; and
- a second inverter chain for including a plurality of inverters connected in series and inverting an output of the fourth inverter.

30. The voltage generator as recited in claim 21, wherein the second driving control signal is activated during the activation period of the plurality of bank active signals and the delay time of the second delay unit.

31. The voltage generator as recited in claim 21, wherein the second driving control signal is activated in synchronization with inactivation of a signal output by the third logic operator and inactivated in synchronization with activation of a signal output by the second delay unit.

32. The voltage generator as recited in claim 21, wherein the second selecting driver includes:
- a pull-down driver connected between the VSS and an output stage of the pull-down driving signal for receiving the bias voltage through the gate; and
- a second selecting unit for selectively operating the pull-down driver according to the second driving control signal.

33. The voltage generator as recited in claim 32, wherein the pull-down driver includes a first NMOS transistor.

34. The voltage generator as recited in claim 32, wherein the second selecting unit includes:
- a third inverter for inverting the second driving control signal;
- a fourth inverter for inverting an output of the third inverter;
- a second NMOS transistor connected between the VSS and a gate of the pull-down driver for receiving an output of the fourth inverter through a gate; and
- a second transmission gate selectively connecting the gate of the pull-down driver with the bias voltage according to outputs of the third and the fourth inverters.

35. The voltage generator as recited in claim 1, wherein the active control unit includes:
- means for increasing the control transistors of the pull-up/down voltage drivers in the stand by mode; and
- means for decreasing the control transistors of the pull-up/down voltage drivers during the activation period of the bank active signals and the certain delay period in the active mode.

36. The voltage generator as recited in claim 35, wherein the active control unit includes:
- a third active control unit for decreasing the number of the transistors in the pull-up voltage drivers during the activation period of the bank active signals and the period delayed as the first delay time in the active mode; and
- a four active control unit for decreasing the number of the transistors in the pull-down voltage drivers during the activation period of the bank active signals and the period delayed as the second delay time which is different from the first delay time in the active mode.

* * * * *